(12) United States Patent
Curcic (10) Patent No.: US 9,816,888 B2
(45) Date of Patent: Nov. 14, 2017

(54) SENSOR AND METHOD FOR DETECTING A POSITION OF AN EFFECTIVE SURFACE OF THE SENSOR

(71) Applicant: Robert Bosch GmbH, Stuttgart, DE (US)

(72) Inventor: Michael Curcic, Stuttgart (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 14/900,168

(22) PCT Filed: Jun. 16, 2014

(86) PCT No.: PCT/EP2014/062519
§ 371 (c)(1),
(2) Date: Dec. 20, 2015

(87) PCT Pub. No.: WO2014/202508
PCT Pub. Date: Dec. 24, 2014

(65) Prior Publication Data
US 2016/0146686 A1    May 26, 2016

(30) Foreign Application Priority Data

Jun. 20, 2013  (DE) .................. 10 2013 211 626

(51) Int. Cl.
*G01L 9/10* (2006.01)
*G01L 9/14* (2006.01)
(Continued)

(52) U.S. Cl.
CPC .................. *G01L 9/14* (2013.01); *G01L 9/16* (2013.01); *G01R 33/098* (2013.01)

(58) Field of Classification Search
None
See application file for complete search history.

(56) References Cited

U.S. PATENT DOCUMENTS

2007/0025027 A1    2/2007  Chung et al.
2007/0099031 A1    5/2007  Chung et al.
2011/0308323 A1   12/2011  Oizumi

FOREIGN PATENT DOCUMENTS

DE    10 2008 042 359 A1    4/2010

OTHER PUBLICATIONS

International Search Report corresponding to PCT Application No. PCT/EP2014/062519, dated Oct. 1, 2014 (German and English language document) (7 pages).
(Continued)

*Primary Examiner* — Andre Allen
(74) *Attorney, Agent, or Firm* — Maginot, Moore & Beck LLP (57) ABSTRACT

A sensor for detecting a position of an effective surface of the sensor includes a first magnetic field generator, a magnetic tunnel resistor, and a second magnetic field generator. The first magnetic field generator generates a first magnetic field that is oriented in an axis of a movement direction of the effective surface. The magnetic tunnel resistor is spaced from the first magnetic field generator in the extension of the axis. The magnetic tunnel resistor has a first magnetic layer, a second magnetic layer, and a tunnel barrier. The tunnel barrier is arranged between the first layer and the second layer, and the first layer is electrically insulated from the second layer. The second magnetic field generator is configured to generate a second magnetic field that is oriented transversally to the axis. The second magnetic field generator is oriented in a fixed manner relative to the tunnel resistor.

12 Claims, 7 Drawing Sheets

(51) Int. Cl.
*G01L 9/16* (2006.01)
*G01R 33/09* (2006.01)

(56) References Cited

OTHER PUBLICATIONS

Drews, Andre et al.; "Nonlinear magnetic vortex gyration"; Physical Review; Apr. 20, 2012; pp. 14417-1-14417-7; American Physical Society (7 pages).

SENSOR AND METHOD FOR DETECTING A POSITION OF AN EFFECTIVE SURFACE OF THE SENSOR

BACKGROUND

This application is a 35 U.S.C. §371 National Stage Application of PCT/EP2014/062519, filed on Jun. 16, 2014, which claims the benefit of priority to Ser. No. DE 10 2013 211 626.8, filed on Jun. 20, 2013 in Germany, the disclosures of which are incorporated herein by reference in their entirety.

The present disclosure relates to a sensor for detecting a position of an effective surface of the sensor and a method for detecting a position of an effective surface of the sensor.

Pressure exerts a force on a surface, which is deformed by the pressure due to an elasticity of a material of the surface. The deformation may be measured in order to be able to draw conclusions about the pressure via characteristic material values.

U.S. Pat. No. 2011/0308323 A1 describes a piezoresistive pressure sensor.

SUMMARY

Against this background, the present disclosure introduces a sensor for detecting a position of an effective surface of the sensor and a method for detecting a position of an effective surface of the sensor. Advantageous embodiments result from the respective subclaims and the following description.

A relative change in distance between a first sensor component and a second sensor component may be detected via a change in a resonant frequency of an oscillatory magnetic-electrical structure which is coupled with the second sensor component in. The resonant frequency may be determined in a highly accurate manner without being influenced. The resonant frequency of the magnetic-electrical structure may be influenced by a movable, constant magnetic field perpendicular to the structure which is coupled with the first sensor component.

A sensor for detecting a position of an effective surface of the sensor is introduced, wherein the sensor has the following features:

a first magnetic field generator for generating a first magnetic field which is oriented on an axis of a direction of motion of the effective surface, wherein the first magnetic field generator is fixedly linked to the movable effective surface;

a magnetic tunnel resistor which is situated in extension of the axis at a distance from the magnetic field generator and has a first magnetic layer, a second magnetic layer, and a tunnel barrier, wherein the first layer and the second layer are magnetized transversely to the axis, wherein the first layer is contacted by a first terminal of the tunnel resistor, the second layer is situated adjacent to the first layer and is contacted by a second terminal of the tunnel resistor, and the tunnel barrier is situated between the first layer and the second layer and electrically insulates the first layer from the second layer; and a second magnetic field generator for generating a second magnetic field which is oriented transversely to the axis, wherein the second magnetic field generator is fixedly oriented with respect to the tunnel resistor.

An effective surface may be understood to mean a spring-mounted contact surface for a force and/or a pressure. A tunnel resistor may be a stack made up of multiple magnetized layers. In a first orientation of the magnetizations of the first and second layers with respect to each other, the tunnel resistor has a first resistance value. In a second orientation of the magnetizations with respect to each other, the tunnel resistor has a second resistance value, wherein the orientations and resistance values are different from each other. The second magnetic field may excite a resonant oscillation of the magnetization in the first layer of the tunnel resistor. The first magnetic field may influence the resonant frequency of the oscillation.

The first magnetic field generator may be designed as a permanent magnet, wherein magnetic dipoles of the permanent magnet are oriented on the axis. A permanent magnet may be used without a power supply. A high level of reliability of the sensor is thereby achieved.

The first magnetic field generator may be designed as an electrically conductive coil, wherein the one plane of the coil may be oriented transversely to the axis. The coil may provide the first magnetic field if it carries current. The coil may have a low weight. An excellent response behavior of the sensor thereby results, since the effective surface has a low moment of inertia.

The second magnetic field generator may be designed as an electrical conductor, wherein the conductor may be oriented transversely to the axis and may be situated on a side of the tunnel resistor opposite the first magnetic field generator. A current-carrying electrical conductor may provide a controllable magnetic field whose magnitude and direction are freely selectable. An electrical conductor has a low remanence.

The conductor may project laterally beyond the tunnel resistor. The second magnetic field may be straightened in the area of the first layer via a projection. As a result, the magnetization of the layer may be uniformly influenced.

The first magnetic layer of the tunnel resistor may be formed in the shape of a square. A square shape results in lower resistances when influencing the magnetization. The square shape independently develops a particularly advantageous magnetization characteristic during manufacture.

Magnetic dipoles of the first magnetic layer may be oriented on an outer edge of the first magnetic layer and produce a magnetic ring closure in the first magnetic layer. Due to the orientation on the outer edge, sectors having a different magnetization direction may result in the layer. Due to the ring closure, the layer may be magnetically neutrally salient in the absence of external influences. Furthermore, magnetic fields may run to the greatest possible extent within the layer.

The second magnetic field generator may be designed to provide the second magnetic field using an electric current flow. The magnetic field generator may be equipped with an electronic system which makes possible a controlled current supply.

The second magnetic field generator may be designed to induce the second magnetic field to oscillate in resonance using an alternating current. The magnetic field generator may adjust the current flow to the resonant frequency of the layer. The magnetic field generator may be frequency-agile.

The sensor may include a device for detecting a current flow through the tunnel resistor, wherein the device for detecting is connected to the first terminal and the second terminal of the tunnel resistor and is designed to provide a voltage between the terminals. The sensor becomes operational via the device for detecting. The current flow may be transmitted as a digital value. The device for detecting may also include a power supply.

The sensor may include a device for evaluating the current flow, wherein the device is designed to determine a distance between the tunnel resistor and the effective surface using a processing specification, the current flow, and/or a shift of a resonant frequency of the tunnel resistor. The unit for evaluating may output the distance as a value. The unit may also ascertain a force acting on the effective surface via a processing specification and provide it as a value of the force as a piece of information.

Furthermore, a method is introduced for detecting a position of an effective surface of a sensor according to the approach introduced here, wherein the method includes the following steps:

providing the second magnetic field;

detecting the current flow through the tunnel resistor; and evaluating the current flow using a processing specification, the current flow, and/or a shift of a resonant frequency of the tunnel resistor, in order to determine a distance between the tunnel resistor and the effective surface.

BRIEF DESCRIPTION OF THE DRAWINGS

The present disclosure is explained in greater detail below by way of example with the aid of the appended drawings.

DETAILED DESCRIPTION

In the following description of advantageous exemplary embodiments of the present disclosure, identical or similar reference numerals are used for the elements depicted in the various figures and acting similarly, a repeated description of these elements being omitted.

Pressure sensors may be based on the capacitive or piezoresistive measuring principle. In a capacitive measuring principle, two capacitor electrodes may be used, wherein one is designed as a pressure-sensitive diaphragm. When pressure is applied, the diaphragm is displaced, whereby the distance between the electrodes, and thus the capacitance, changes. The change in capacitance is proportional to the applied pressure and is used as a measured variable. In the case of piezoresistive sensor elements, piezoresistive resistance elements may be situated on the pressure-sensitive diaphragm, which are displaced via the application of pressure. Since the length, and thus the resistance, of the resistive elements changes, it is possible to deduce the applied pressure with the aid of a resistance measurement.

Figure 1:
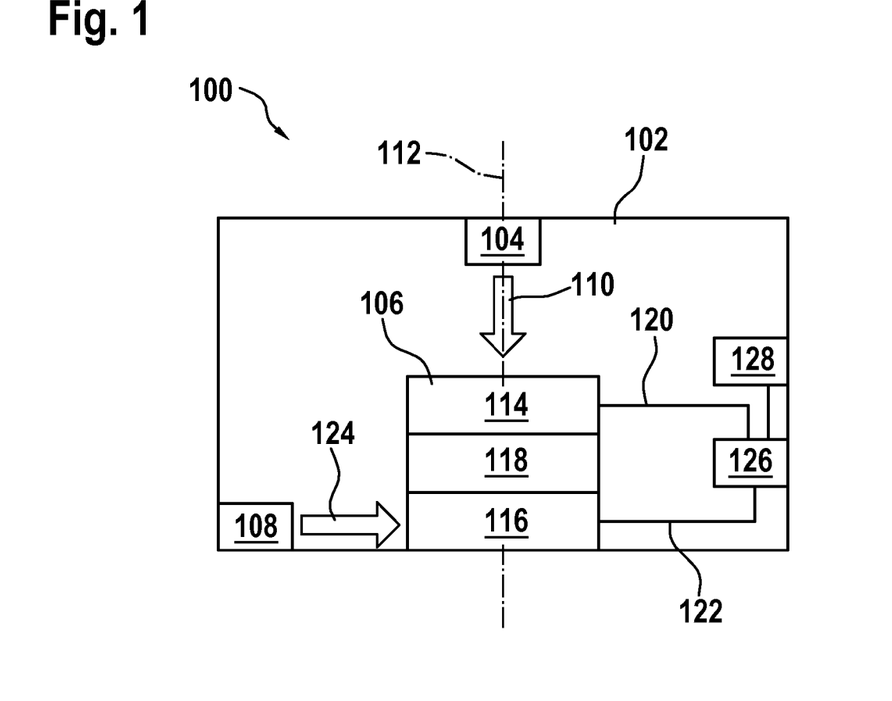
FIG. 1 shows a schematic representation of a sensor according to one exemplary embodiment of the present disclosure.

FIG. 1 shows a block diagram of a sensor 100 according to one exemplary embodiment of the present disclosure. The sensor 100 is designed to detect a position of an effective surface 102 of the sensor 100. The effective surface 102 is flexible. When the effective surface 102 is stressed, the effective surface 102 deformed. The sensor 100 includes a first magnetic field generator 104, a magnetic tunnel resistor 106, and a second magnetic field generator 108. The first magnetic field generator 104 is designed to generate a first magnetic field 110 which is oriented on an axis 112 of a direction of motion of the effective surface 102. The first magnetic field generator 104 is fixedly linked to the movable effective surface 102. The magnetic tunnel resistor 106 is situated in extension of the axis 112 at a distance from the first magnetic field generator 104. The magnetic tunnel resistor 106 is connected to an edge of the effective surface 102 via a housing of the sensor 100. The first magnetic field generator 104 is situated at a movable portion of the effective surface 102. The magnetic tunnel resistor 106 has a first magnetic layer 114, a second magnetic layer 116, and a tunnel barrier 118. The first layer 114 and the second layer 116 are magnetized transversely to the axis 112. The first layer 114 is contacted by a first terminal 120 of the tunnel resistor 106. The second layer 116 is situated adjacent to the first layer 114 and is contacted by a second terminal 122 of the tunnel resistor 106. The tunnel barrier 118 is situated between the first layer 114 and the second layer 118 and electrically insulates the first layer 114 from the second layer 116. The second magnetic field generator 108 is designed to generate a second magnetic field 124 which is oriented transversely to the axis. The second magnetic field generator 108 is oriented fixedly with respect to the tunnel resistor 106.

In one exemplary embodiment, the first magnetic field generator 104 is designed as a permanent magnet 104, wherein magnetic dipoles of the permanent magnet 104 are oriented on the axis 112. Either a north pole or a south pole of the permanent magnet 104 points directly toward the tunnel resistor 106.

In one exemplary embodiment, the first magnetic field generator 104 is designed as an electrically conductive coil 104, wherein the plane of the coil 104 is oriented transversely to the axis 112. The first magnetic field 110 is pointed directly toward the tunnel resistor 106 via the coil 104, which is oriented perpendicularly to the axis 112.

In one exemplary embodiment, the second magnetic field generator 108 is designed as an electrical conductor 108, wherein the conductor 108 is oriented transversely to the axis 112 and is situated on a side of the tunnel resistor 106 opposite the first magnetic field generator 104. The conductor 108 generates the second magnetic field 124 according to the right-hand rule. Field lines of the second magnetic field 124 penetrate the tunnel resistor 106 and influence the magnetization distribution within at least one of the layers 114, 116. As a result, an electrical resistance of the tunnel resistor 106 is influenced.

In one exemplary embodiment, the conductor 108 projects laterally beyond the tunnel resistor 106. The conductor 108 is designed as a single flattened bar and formed in a shape which is wider than a stack of the tunnel resistor 106. Due to the projection, the field lines around the conductor 108 are also flattened along the flat surface. The field lines which penetrate the tunnel resistor 106 are thus oriented approximately perpendicularly to the axis 112.

In one exemplary embodiment, the first magnetic layer 114 of the tunnel resistor 106 is formed in the shape of a square. The tunnel resistor 106 is designed as a stack. The stack may have the same dimensions as the first layer 114.

In one exemplary embodiment, magnetic dipoles of the first magnetic layer 114 are oriented on an outer edge of the first magnetic layer 114 and produce a magnetic ring closure in the first magnetic layer 114. As a result of the ring closure, the effect of the dipoles is neutralized and a balanced magnetization results. The first layer 114 is outwardly magnetically neutral. If an external magnetic field penetrates the first layer 114 and is oriented on one of the outer edges, the magnetization along the relevant outer edge is brought out of balance. An outward magnetic effect of the first layer 114 thereby results.

In one exemplary embodiment, the second magnetic field generator 108 is designed to provide the second magnetic field 124 using an electric current flow. The second magnetic field generator 108 is an electric magnet or a coil, an axis of action of the second magnetic field generator 108 being oriented transversely to the axis 112.

In one exemplary embodiment, the second magnetic field generator 108 is designed to induce the second magnetic field 124 to oscillate in resonance using an alternating current. The first layer 114 and the second magnetic field 124 mutually influence each other. They produce an oscillatory system. The second magnetic field 124 is changed in magnitude and direction via alternating current or current having a variable current strength. As a result, the first layer 114 is influenced and is excited to oscillation.

In one exemplary embodiment, the sensor 100 includes a device 126 for detecting a current flow through the tunnel resistor 106. The device 126 for detecting is connected to the first terminal 120 and the second terminal 122 of the tunnel resistor 106. The device 126 for detecting is designed to provide a voltage between the terminals 120, 122. An electric resistance of the tunnel resistor 106 is a function of a ratio of rectified magnetic field components in the first layer 114 and the second layer 116. The greater the ratio is, the greater the conductivity of the tunnel resistor 106 is. The current flow thus represents the ratio.

In one exemplary embodiment, the sensor 100 includes a device 128 for evaluating the current flow, wherein the device 126 is designed to determine a distance between the tunnel resistor 106 and the effective surface 102 using a processing specification, the current flow, and/or a shift of a resonant frequency of the tunnel resistor 106. The first magnetic field 110 influences the interaction between the second magnetic field 124 and the first layer 114. The resonant frequency of the oscillatory system made up of the first layer and the second magnetic field 124 is influenced via a change in distance between the effective surface including the first magnetic field generator 104 which is coupled to it and the tunnel resistor 106. The closer the effective surface gets to the tunnel resistor 106, the stronger the first magnetic field 110 becomes.

In the structural element 100 provided, the outer perpendicular magnetic field 110 is generated via a permanent magnet 104 or a microcoil 104 which is situated on an opposite diaphragm 102. When the diaphragm 102 is subjected to pressure, the distance between the permanent magnets/coil 104 and the permalloy layer 114 changes. The distance-related change in the perpendicular magnetic field strength at the location of the permalloy layer 114 causes a shift of the resonant frequency of the gyrotropic motion. The applied pressure is deduced by measuring the resonant frequency shift.

The structural element 100 described here and the associated method may, for example, be used for microphones, acceleration sensors, and rotational speed sensors.

Figure 2:
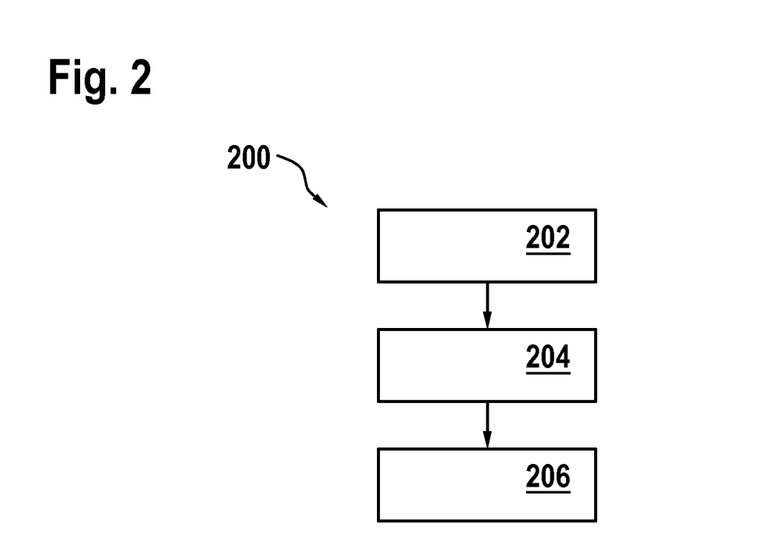
FIG. 2 shows a flow chart of a method for detecting a position of an effective surface of a sensor according to one exemplary embodiment of the present disclosure.

FIG. 2 shows a flow chart of a method 200 for detecting a position of an effective surface of a sensor according to one exemplary embodiment of the present disclosure. The method 200 may be carried out on a sensor as shown in FIG. 1. The method 200 includes a step 202 of providing, a step 204 of detecting, and a step 206 of evaluating. In the step 202 of providing, the second magnetic field is provided via the second magnetic field generator. The first layer of the tunnel resistor is thereby excited to oscillation. Due to the oscillation, the electric resistance of the tunnel resistor changes periodically. In the step 204 of detecting, the current flow is detected via the tunnel resistor. For carrying out the detection, a voltage is applied to the tunnel resistor. The current flow changes according to the oscillation of the first layer. In the step 206 of evaluating, the current flow is evaluated using a processing specification. The current flow is evaluated for a shift of a resonant frequency of the tunnel resistor in order to determine a distance between the tunnel resistor and the effective surface.

Figure 3:
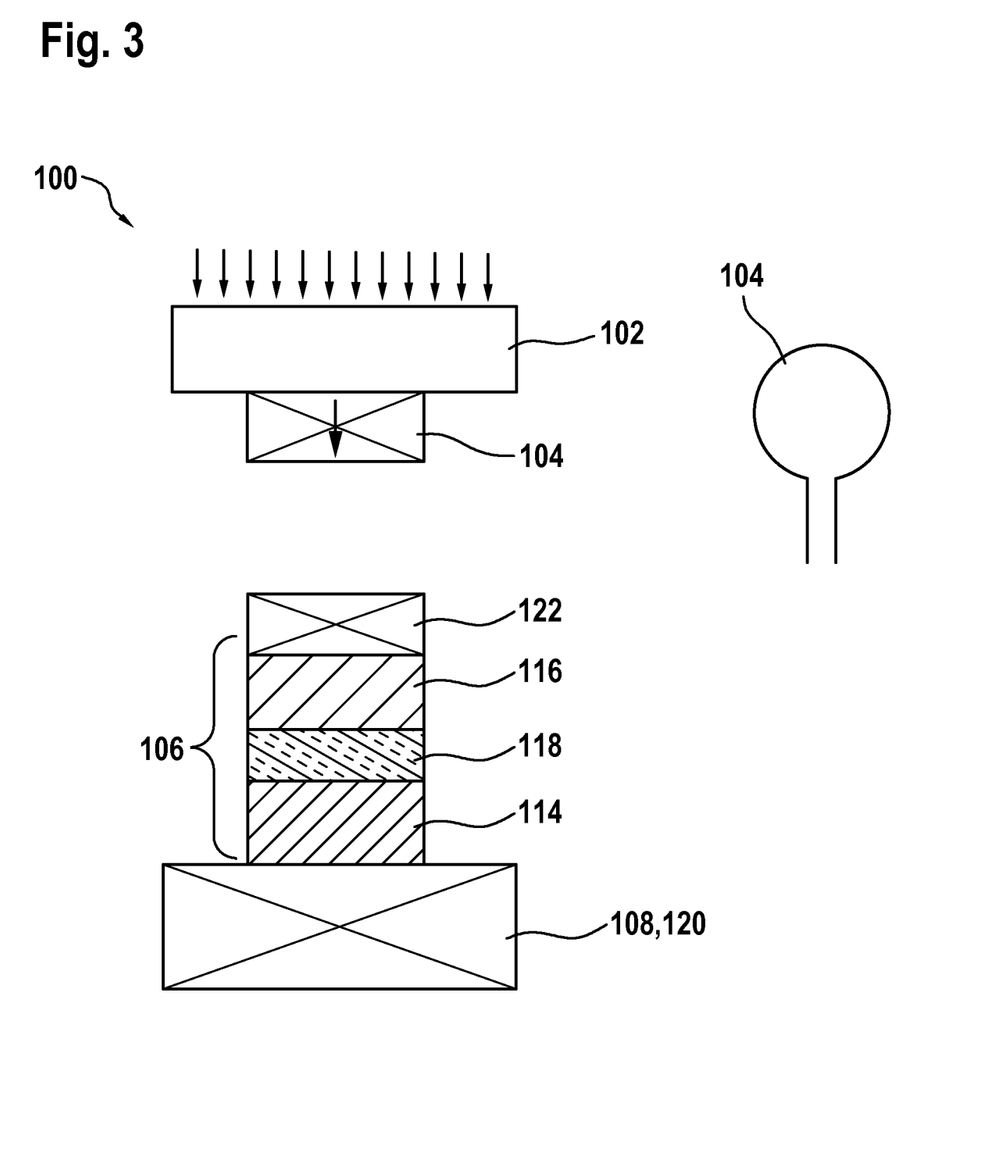
FIG. 3 shows a representation of a sensor according to one exemplary embodiment of the present disclosure.

FIG. 3 shows a representation of a sensor 100 according to one exemplary embodiment of the present disclosure. The sensor 100 corresponds to the sensor shown in FIG. 1. Here, the sensor 100 is shown without the housing. The effective surface 102 has a side facing toward the pressure and a side facing away from the pressure. The first magnetic field generator 104 is situated on the side of the operating diaphragm 112 facing away from the pressure. In this exemplary embodiment, the first magnetic field generator 104 is designed as a permanent magnet 104. The magnetic tunnel resistor 106 is situated here between the first terminal 120 and the second terminal 122. The first terminal 120 and the second terminal 122 are designed as copper contacts. The second terminal 122 has the same width as the tunnel resistor 106. The first terminal 120 has a greater width than the tunnel resistor 106. The first terminal 120 projects laterally beyond the tunnel resistor 106. Here, the first terminal 120 is designed as the second magnetic field generator 108. For this purpose, the first terminal 120 is oriented linearly transversely to the axis of the direction of motion of the effective surface 102. The tunnel resistor 106 is situated on the second magnetic field generator 108. The second magnetic field generator 108 is electrically contacted on opposite sides. One of the contacts furthermore acts as the first terminal 120 for the first magnetic layer 114. The second magnetic layer 116 of the magnetic tunnel resistor 106 faces the first magnetic field generator 104 and the effective surface 102. The tunnel barrier 118 is situated between the first magnetic layer 114 and the second magnetic layer 116 in the form of a thin electrically insulating layer 118. In one exemplary embodiment, the tunnel barrier 118 is made up of magnesium oxide MgO.

In one exemplary embodiment, the first magnetic field generator 104 is designed as a coil 104. In addition to the side view of the sensor 100, a top view onto a corresponding coil 104 is shown.

FIG. 3 shows an active magnetic pressure sensor 100. The pressure sensor 100 contains a sensor element in the form of a thin magnetic permalloy layer 114 having a vortex-shaped magnetization distribution. Here, a shift of a resonant frequency of the magnetization distribution excited to gyrotropic motion acts as a measured variable. The shift is proportional to the applied pressure.

The sensor structural element 100 comprises a magnetic permalloy layer 114 which has a magnetic vortex. The magnetic permalloy layer 114 is fixed. The magnetic permalloy layer 114 has a predefined size. In particular, the permalloy layer 114 is not larger than 6×6 µm². The magnetic permalloy layer 114 has a predefined thickness. In particular, the permalloy layer 114 is not thicker than 150 nm. The magnetic permalloy layer 114 is integrated into a magnetic tunnel junction (MTJ) stack 106 in order to detect the gyrotropic motion. A pressure-sensitive, movable diaphragm 102 includes a perpendicularly magnetized permanent magnet 104 (cobalt Co or neodymium iron boron NdFeB). Alternatively, the diaphragm 102 includes a coil which is used for generating the perpendicular magnetic field 110.

Since frequency measurements are potentially highly precise, the sensor 100 provided here has extremely high sensitivity. A very small size is possible via miniaturization. The sensor 100 has high linearity. Unlike with capacitive measuring principles, there is no leakage current problem. The sensor provided here may be easily enhanced for determining differential pressure.

The cross-sectional view of the provided structural element 100 is shown in FIG. 3. The alternating current required for exciting the gyration motion is fed in via the microstrip line 108. The measurement of the tunnel resistance proportional to the gyration motion is carried out via a voltage tap 120 between the copper contact 122 and the microstrip line 108. A permanent magnet 104 having perpendicular magnetization, which generates the perpendicular magnetic field, is attached to the movable diaphragm 102. Alternatively, instead of the permanent magnet 104, a coil 104 may also be used.

Figure 4:
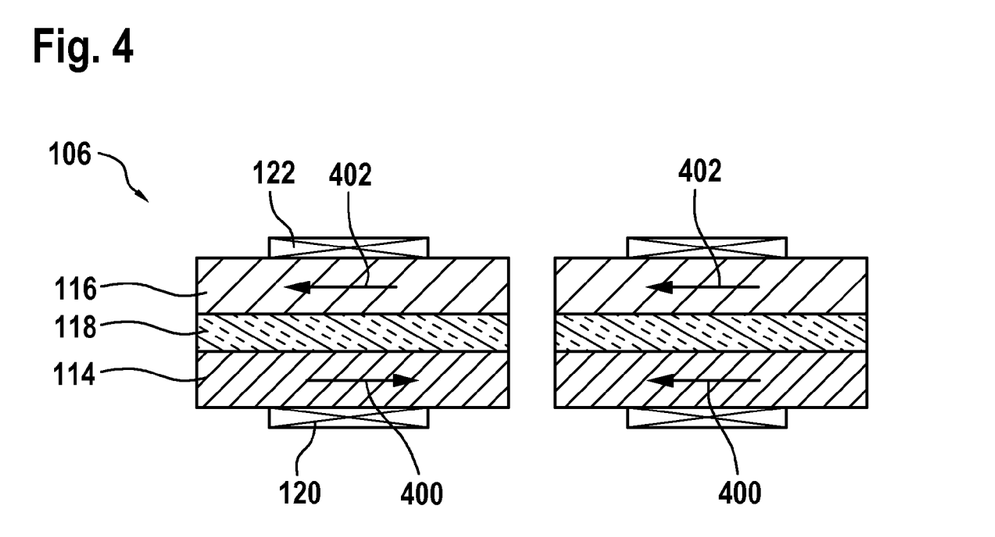
FIG. 4 shows a representation of a method of operation of a magnetic tunnel resistor according to one exemplary embodiment of the present disclosure.

FIG. 4 shows a representation of a method of operation of a magnetic tunnel resistor 106 according to one exemplary embodiment of the present disclosure. The magnetic tunnel resistor 106 essentially corresponds to the tunnel resistor from FIGS. 1 and 3. As in FIGS. 1 and 3, the tunnel resistor 106 has a first magnetic layer 114, a second magnetic layer 116, and a tunnel barrier 118. The first layer 114 is electrically contacted by the first terminal 120; the second layer 116 is electrically contacted by the second terminal 122. The magnetic tunnel resistor 106 is shown in two different states. In the first state, the first layer 114 has a resulting magnetization 400 which is oriented oppositely to a magnetization 402 of the second layer. As a result, the tunnel resistor 106 has an electric resistance $R_{ap}$. In the second state, the first layer 114 has a resulting magnetization 400 which is oriented in the same direction as a magnetization 402 of the second layer 116. As a result, the tunnel resistor 106 has an electric resistance $R_p$. The resistance $R_{ap}$ is significantly higher than the resistance $R_p$.

The gyrotropic motion which is required for determining the resonant frequency is achieved via a magnetic tunnel contact 106 (MTJ stack). This makes it possible to electrically detect the gyrotropic motion of the vortex-shaped magnetization distribution.

The magnetic tunnel contact 106 makes use of the fact that the electric resistance is a function of the relative orientation of the magnetization 400, 402 of the two ferromagnetic layers 114, 116. If the magnetization 402 of the so-called fixed layer 116 is antiparallel to the magnetization 400 of the remagnetizable layer 114, the so-called free layer 114, the resistance is higher than in the case of a taut positioning of the two magnetizations 400, 402. The relative change in resistance, which is approximately 600% at room temperature, is used as a measure.

$$TMR = \frac{R_{ap} - R_p}{R_p}$$

Figure 5:
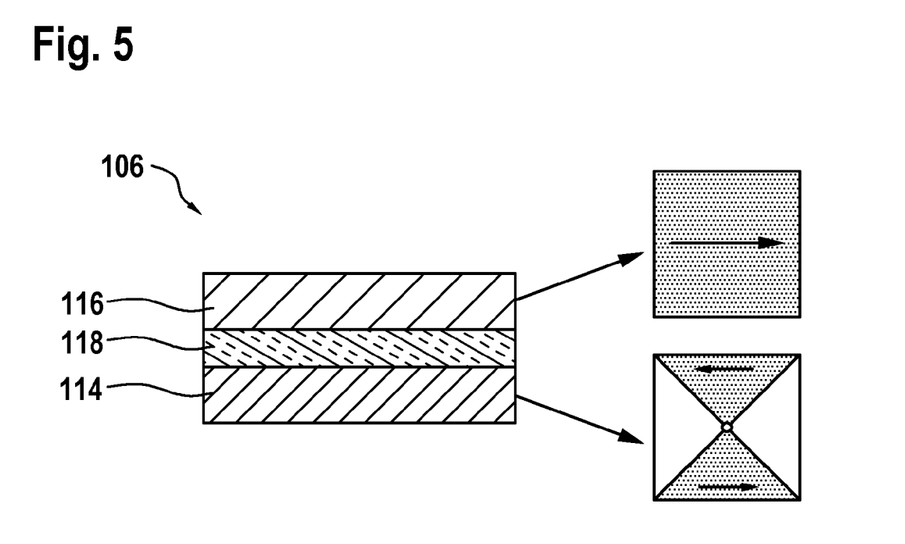
FIG. 5 shows a representation of a magnetic tunnel resistor according to one exemplary embodiment of the present disclosure.

FIG. 5 shows a representation of a schematic structure of a magnetic tunnel resistor 106 according to one exemplary embodiment of the present disclosure. The tunnel resistor 106 corresponds to the tunnel resistor in FIG. 4. The first magnetic layer 114 or free layer or ferromagnet 1 or permalloy is designed as a square wafer having a self-contained ring-shaped magnetization. The dipoles causing magnetization follow a profile of the outer edges of the wafer 114. Four equally large sectors of the magnetization thus result. The magnetization is symmetrical about the center. A magnetic neutrality results for the overall first magnetized layer 114 due to equally large components of the magnetization running in the opposite direction in opposite sectors. The second magnetic layer 116 or fixed layer or ferromagnet 2 is equal in size to the first layer 114. The second magnetic layer 116 is uniformly magnetized in one direction in parallel with two opposite outer edges. The tunnel barrier 118 is situated between the two layers 114, 116. The copper contacts are situated on the free side of the tunnel resistor 106.

Figure 6:
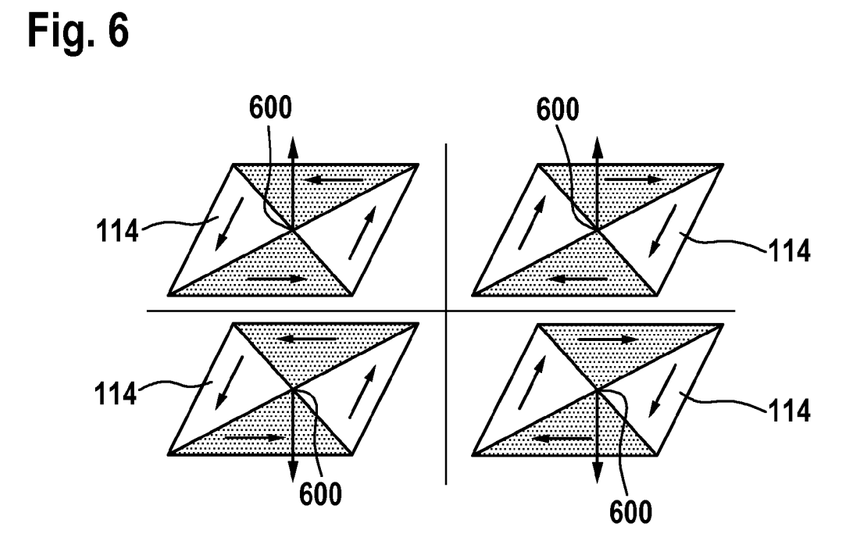
FIG. 6 shows a representation of possible exemplary embodiments of a first magnetic layer of a tunnel resistor according to one exemplary embodiment of the present disclosure.

FIG. 6 shows a representation of possible specific embodiments of a first magnetic layer 114 of a tunnel resistor according to one exemplary embodiment of the present disclosure. The first layers 114 correspond to the first layer in FIG. 5. The various specific embodiments show the four possible magnetization distributions in the first layer 114. The ring-shaped magnetization of the sectors is designed rotating clockwise in two examples and rotating counterclockwise in two examples. A neutral region 600 is situated at a meeting point of the sectors, in which the dipoles are not able to assume any direction of the sectors. The dipoles are uniformly oriented perpendicularly to the wafers in the neutral region 600. The dipoles may be oriented either in a positive direction or in a negative direction. Four possible magnetization distributions result via the two different possibilities, which may all be used in a magnetic tunnel resistor according to the approach provided here.

FIG. 6 shows a vortex-shaped magnetization distribution in square permalloy wafers 114. A thin magnetic and laterally very small magnetic permalloy layer 114 is used as a basic component of the provided structural element, which is integrated into an MTJ stack. In one exemplary embodiment, the layer 114 is between 25 nm and 150 nm thick and has an area of between 250×250 nm² and 6×6 µm². In the case of the specified dimensions, a vortex-shaped magnetization distribution already arises in the initial state, which may assume four possible configurations. FIG. 6 shows all four possibilities. The black arrows indicate the direction of the magnetization in the plane within the four domains in the initial state. The arrow extending perpendicularly from the plane indicates the direction of magnetization of the vortex core 600 having a size of 5 nm to 10 nm. If the magnetization distribution (in-plane distribution) rotates counterclockwise, a vortex having the chirality C=+1 exists. Correspondingly, it is true for C=−1 that the in-plane components of the distribution rotate clockwise. If the vortex core points out of the plane, positive polarity P=+1 exists. Correspondingly, for the opposite direction, a negative polarity P=−1 exists. In the initial state, all four domains are equally large, but have paired opposite magnetizations. The domains or sectors are depicted as white and gray triangles. In the initial state, the overall magnetization is equal to zero.

Figure 7:
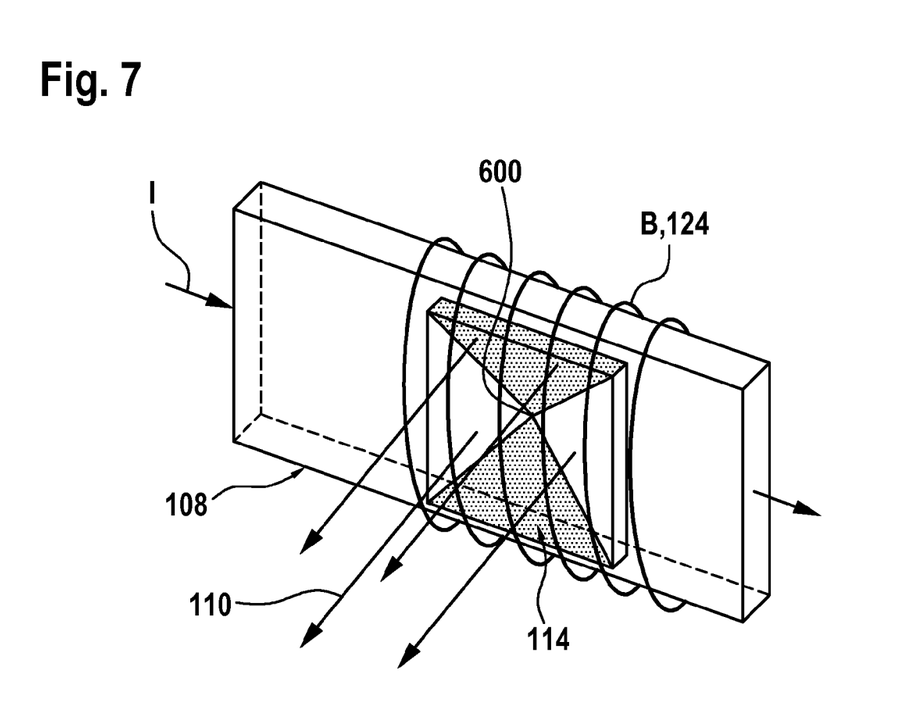
FIG. 7 shows a representation of a second magnetic field generator including a first magnetic layer according to one exemplary embodiment of the present disclosure.

FIG. 7 shows a spatial representation of a second magnetic field generator 108 having a first magnetic layer 114 according to one exemplary embodiment of the present disclosure. As in FIG. 3, the second magnetic field generator 108 is designed as an electric conductor 108 which runs linearly below the first layer 114 and projects laterally beyond the first layer 114. The magnetic field generator 108 has the shape of a bar having a rectangular cross section. In the longitudinal direction of the bar, the magnetic field generator 108 is significantly longer than an edge length of the first layer 114. The stack of the magnetic tunnel resistor is not shown here for reasons of simplification. The magnetic field generator 108 is shown carrying current. A current I having a time-varying current strength $$I = I_0 \sin(\omega_{res} t)$$

is applied to the magnetic field generator 108 in the longitudinal direction. The current I results in a time-varying magnetic field B, $$B_{in\text{-}plane} = B_0 \sin(\omega_{res} t)$$

which is oriented perpendicularly to the current direction according to the right-hand rule. The magnetic field B is the second magnetic field 124, which is oriented transversely to the axis of the direction of motion of the effective surface of the sensor. Since the conductor 108 projects beyond the wafer of the first magnetic layer 114 laterally to the current direction, and has a flat supporting surface for the first layer 114, the field lines of the second magnetic field 124 in the area of the first layer 114 run approximately parallel to the layer 114. The square wafer of the first layer 114 is situated on the second magnetic field generator 108 in such a way that the outer edges of the wafer are oriented on longitudinal edges of the magnetic field generator 108. The field lines of the second magnetic field 124 run parallel to the dipoles in two of the four quadrants of the layer 114, while the field lines run transversely to the dipoles in the two other quadrants. Where the field lines run parallel to the dipoles and their field lines, the magnetic field of the dipoles may be influenced. The magnetic field of the dipoles may be strengthened if the field lines run in the same direction. The magnetic field of the dipoles may be weakened if the field lines run in opposite directions. By strengthening on one side and simultaneously weakening on the other side, a distortion of the overall magnetization of the first magnetic layer 114 occurs. Due to the distortion, the magnetization is no longer balanced. The layer 114 is outwardly magnetic. The neutral region 600 is shifted from the geometric center of the first layer 114.

In addition, FIG. 7 shows the first magnetic field 110, which is oriented on the axis. The first magnetic field 110 is perpendicular to the first layer 114 and is thus parallel to an axis of the neutral region 600. The first magnetic field 110 thus influences the magnetization in the neutral region 600.

FIG. 7 shows the schematic structure without the MTJ stack. The vortex-shaped magnetization distribution of the permalloy is excitable to gyration, resonating with a weak magnetic field oscillating in the plane. In one exemplary embodiment, the exciting magnetic field has a magnetic flux density of between 0.2 mT and 2 mT and an excitation frequency of between 20 MHz and 1 GHz. The resonant frequency of the gyration motion is adjustable or variable via a perpendicularly applied magnetic field $B_{perpendicular}$ having medium intensity. In one exemplary embodiment, the perpendicularly applied magnetic field has a magnetic flux density of between 1 mT and 500 mT.

FIG. 7 shows the basic structure without the MTJ stack. The magnetic field 124 oscillating in the plane is generated via an oscillating current I having a variable frequency which flows through a microstrip line 108 in particular made of copper.

Figure 8:
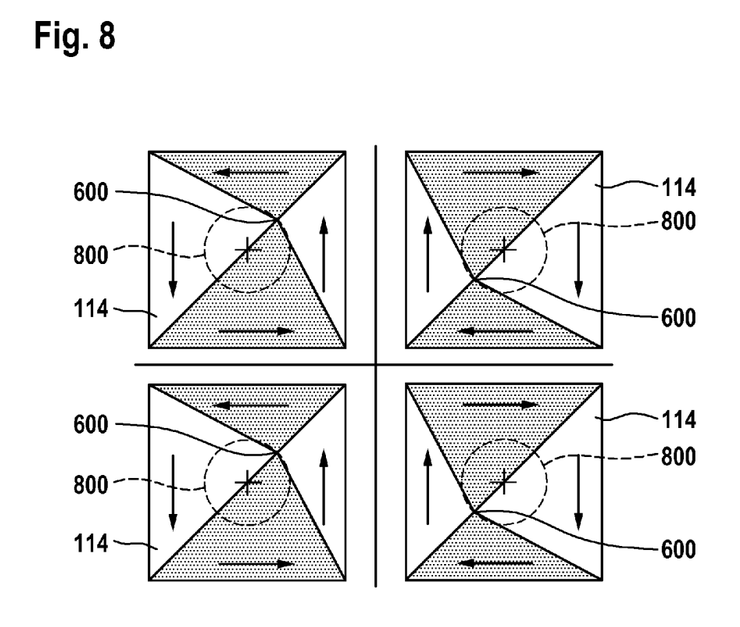
FIG. 8 shows a representation of an oscillation of a magnetization in a first magnetic layer according to one exemplary embodiment of the present disclosure.

FIG. 8 shows a representation of an oscillation of a magnetization in a first magnetic layer 114 according to one exemplary embodiment of the present disclosure. The first layer 114 corresponds to the layer shown in FIGS. 5 to 7. By overlapping the second magnetic field as in FIG. 7, the magnetization of the first layer 114 is distorted in each case. The first layer 114 is depicted at four different points in time of the oscillation. In each case, the neutral region 600 is displaced out of the geometric center of the square layer 114 by a radius, and the four quadrants have different area proportions. During oscillation, the neutral region 600 follows a circular path 800. The change in the area proportions results in a change in the magnetization of the layer 114. The oppositely magnetized quadrants are no longer balanced in terms of magnitude. An overall magnetization of the layer 114 results.

FIG. 8 illustrates the gyrotropic motion for the four possible configurations. In all four cases, the overall magnetization distribution rotates about the center point of the sample, which is represented here by a black cross, having the radius r 800. The chirality results in a 180° phase shift of the rotation, whereas the core polarity determines the direction of rotation. Without the perpendicular magnetic field, a quadruple degeneracy exists, i.e., all four configurations have the same resonant frequency.

FIG. 8 shows instantaneous images of the vortex-shaped magnetization distribution in a square permalloy wafer 114 in the case of resonant excitation via a magnetic field oscillating in the plane, for the four possible configurations.

Figure 9:
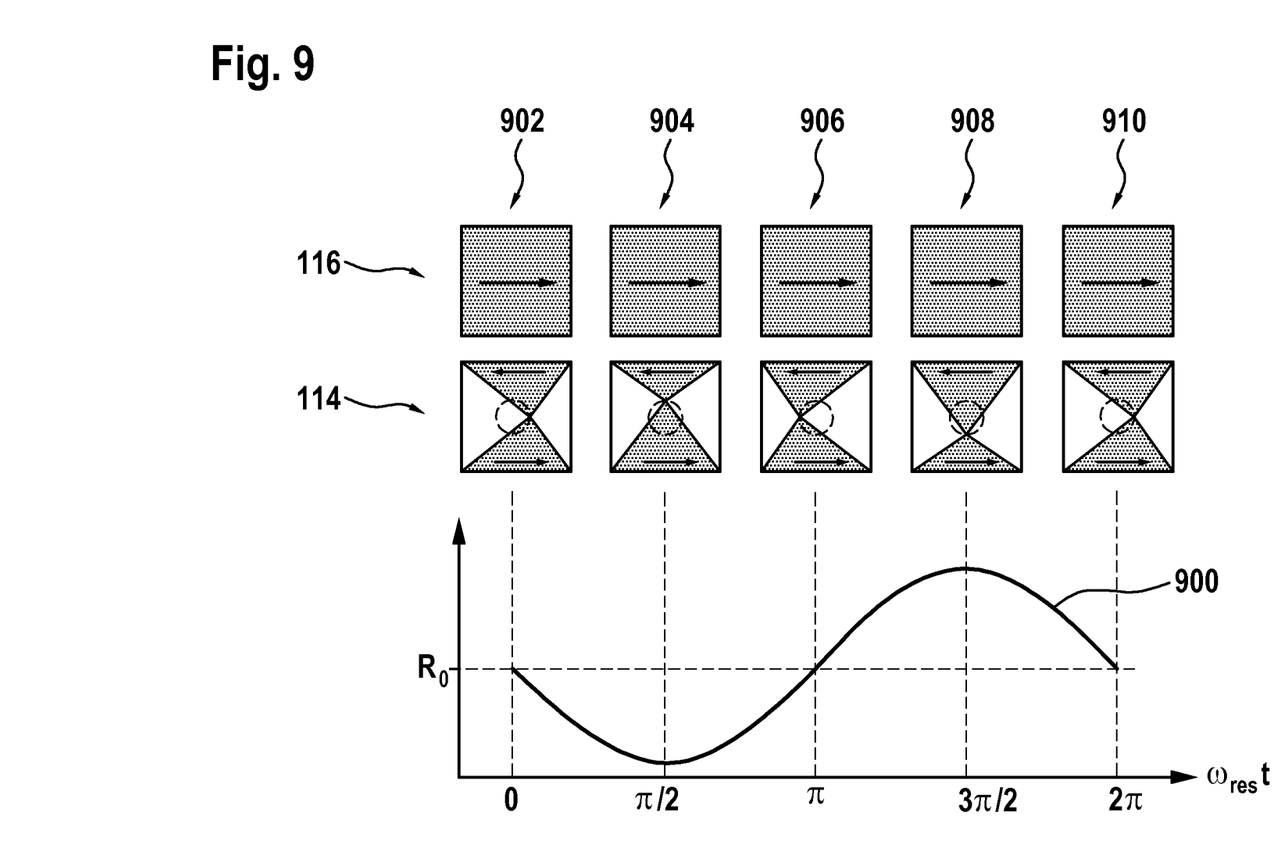
FIG. 9 shows a representation of a resistance profile during an oscillation of a first magnetic layer according to one exemplary embodiment of the present disclosure.

FIG. 9 shows a representation of a resistance profile 900 in the tunnel resistor during an oscillation of a first magnetic layer 114 according to one exemplary embodiment of the present disclosure. Furthermore, FIG. 9 shows multiple states of the magnetic tunnel resistor described in FIG. 5. The first magnetic layer 114 and the second magnetic layer 116 are shown one above the other for each depicted state. The magnetization of the first layer 114 and the neutral region oscillate circularly about the geometric center of the first layer 114, as in FIG. 8. The second layer 116 has a permanent magnetization in one direction. The resistance profile 900 is plotted in a diagram, which has an angle in radian measure on an abscissa of between zero and 2π, i.e., one full revolution plotted about a unit circle. An electrical resistance R is plotted on the ordinate, wherein a value $R_0$ is arranged shifted parallel to the abscissa. The resistance profile 900 has an inverted sinusoidal shape.

In the depiction of the first state 902, the neutral region of the first layer is displaced to the right. This corresponds here to an angle of 0π or 2π. The components of the magnetization of the first layer 114 parallel to the magnetization of the second layer 116 are equal in magnitude. At 0π, the resistance profile 900 has the value $R_0$.

In the depiction of the second state 904, the neutral region is displaced upward. This corresponds here to an angle of π/2. The component of the magnetization of the first layer 114 in the direction of the magnetization of the second layer 116 is greater than the component opposite to the magnetization of the second layer 116. At π/2, the resistance profile 900 has a minimum value. The magnetic tunnel resistor is thus highly electrically conductive.

In the depiction of the third state 906, the neutral region is displaced to the left. This corresponds here to an angle of π. The components of the magnetization of the first layer 114 parallel to the magnetization of the second layer 116 are again equal in magnitude. At π, the resistance profile 900 again has the value $R_0$.

In the depiction of the fourth state 908, the neutral region is displaced downward. This corresponds here to an angle of 3π/2. At 3π/2, the resistance profile 900 has a maximum value. The magnetic tunnel resistor is thus poorly electrically conductive.

In the depiction of the fifth state 910, the neutral region of the first layer is again displaced to the right. This corresponds here to an angle of 2π. The components of the magnetization of the first layer 114 parallel to the magnetization of the second layer 116 are again equal in magnitude. At 2π, the resistance profile 900 has the value $R_0$. At 2π, the starting angle is thus reached again.

FIG. 9 shows the functionality of the MTJ stack for the electrical detection of the gyration motion using the example of a resonantly driven vortex structure in the case of resonant excitation with C=+1 and P=+1.

In the structural element provided, the permalloy layer 114 is used as a free layer. The functionality is illustrated by a fixed layer 116 magnetized in the positive x-direction. If the sample is not excited, for example, via an excitation outside the resonant frequency, the component of the magnetization which is parallel to the fixed layer 116 and the component which is antiparallel are equal in magnitude. The resistance is $R_0$. If the magnetization distribution in the permalloy layer 114 is excited to gyration, the components change accordingly and the resistance oscillates sinusoidally at the resonant frequency about $R_0$. Generally, the fixed layer 116 may be oriented arbitrarily in the plane. Since only the scalar product of the overall magnetization and the magnetization of the fixed layer 116 enter into the change in resistance, this fact becomes noticeable only via an additional phase shift for excitation, which, however, is irrelevant in a frequency measurement.

Figure 10:
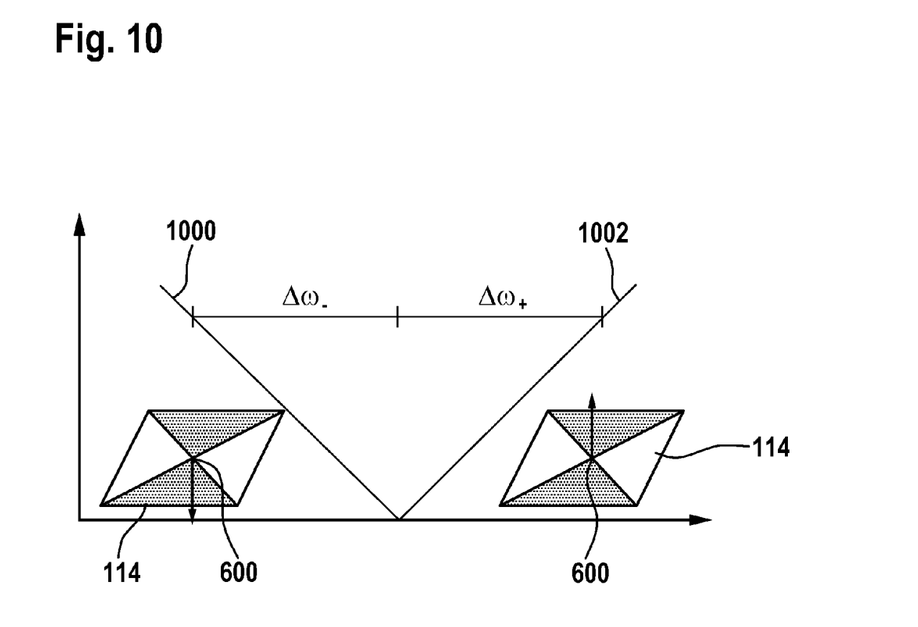
FIG. 10 shows a representation of a change in a resonant frequency of a first magnetic layer in the case of a change in the distance of the effective surface according to one exemplary embodiment of the present disclosure.

FIG. 10 shows a depiction of a change in a resonant frequency of a first magnetic layer 114 in the case of a change in the distance of the effective surface according to one exemplary embodiment of the present disclosure. The change is plotted in a diagram which displays a frequency ω on the abscissa and a magnetic flux density B perpendicular to the magnetic layer on the ordinate. The change is depicted as a first profile 1000 and as a second profile 1002 for two opposite exemplary embodiments of the first layer 114. In the first exemplary embodiment, the layer 114 has a neutral region 600 which is magnetized downward in the depiction. In the second exemplary embodiment, the layer 114 has a neutral region 600 which is magnetized upward in the depiction. Due to the oppositely magnetized neutral regions, the profiles 1000, 1002 have opposite signs. In the case of increasing flux density B, the frequency difference Δω increases linearly. The flux density B increases if the first magnetic field generator having the effective surface approaches the magnetic tunnel resistor. The frequency difference Δω is thus directly, proportionally linkable to the difference in distance via a processing specification.

FIG. 10 depicts a shift of the resonant frequency Δω as a function of the perpendicular magnetic field strength B and the core polarity. The degeneracy is canceled out via the perpendicularly applied magnetic field. The polarity of the vortex core 600 decides whether the resonant frequency increases or decreases linearly to the same extent. The chirality has no influence over it. Since the measurement is limited to the change in frequency Δω, the exact initial state of the layer 114 plays no role, which facilitates the preparation of the permalloy layer 114.

The exemplary embodiments described and shown in the figures are selected only by way of example. Different exemplary embodiments may be combined completely or with respect to individual features. One exemplary embodiment may also be supplemented by features of an additional exemplary embodiment.

Method steps according to the present disclosure may furthermore be repeated and executed in a sequence other than the one described.

If an exemplary embodiment includes an "and/or" link between a first feature and a second feature, this is to be read as meaning that the exemplary embodiment according to one specific embodiment has both the first feature and the second feature and has either only the first feature or only the second feature according to an additional specific embodiment.

The invention claimed is:

1. A sensor for detecting a position of an effective surface of the sensor, comprising:
   a first magnetic field generator configured to generate a first magnetic field that is oriented on an axis of a direction of motion of the effective surface, wherein the first magnetic field generator is fixedly linked to the movable effective surface;
   a magnetic tunnel resistor situated in extension of the axis at a distance from the first magnetic field generator, the magnetic tunnel resistor having a first magnetic layer, a second magnetic layer, and a tunnel barrier, wherein the first magnetic layer and the second magnetic layer are magnetized transversely to the axis, wherein the first magnetic layer is contacted by a first terminal of the tunnel resistor, the second magnetic layer is situated adjacent to the first magnetic layer and is contacted by a second terminal of the tunnel resistor, and the tunnel barrier is situated between the first magnetic layer and the second magnetic layer and electrically insulates the first magnetic layer from the second magnetic layer; and
   a second magnetic field generator configured to generate a second magnetic field that is oriented transversely to the axis, wherein the second magnetic field generator is fixedly oriented with respect to the tunnel resistor,
   wherein the second magnetic field generator is configured to induce the second magnetic field to oscillate using an alternating current,
   wherein the first magnetic layer has a vortex-shaped magnetization distribution, and
   wherein the vortex-shaped magnetization distribution is excited to gyrotropic motion by the oscillating second magnetic field, the gyrotropic motion having a resonant frequency that is dependent upon the position of the effective surface of the sensor.

2. The sensor as claimed in claim 1, wherein the first magnetic field generator is further configured as a permanent magnet, wherein magnetic dipoles of the permanent magnet are oriented on the axis.

3. The sensor as claimed in claim 1, wherein the first magnetic field generator is further configured as an electrically conductive coil, wherein one plane of the coil is oriented transversely to the axis.

4. The sensor as claimed in claim 1, wherein the second magnetic field generator is further configured as an electrical conductor, wherein the conductor is oriented transversely to the axis and is situated on a side of the tunnel resistor opposite the first magnetic field generator.

5. The sensor as claimed in claim 4, wherein the conductor projects laterally beyond the tunnel resistor.

6. The sensor as claimed in claim 1, wherein the first magnetic layer of the tunnel resistor is formed in the shape of a square.

7. The sensor as claimed in claim 6, wherein magnetic dipoles of the first magnetic layer are oriented on an outer edge of the first magnetic layer and define a magnetic ring closure in the first magnetic layer.

8. The sensor as claimed in claim 1, further comprising a first device configured to detect a current flow through the tunnel resistor, wherein the first device is connected to the first terminal and the second terminal of the tunnel resistor and is further configured to generate a voltage between the terminals.

9. The sensor as claimed in claim 8, further comprising a second device configured to evaluate the current flow, wherein the second device is further configured to determine a distance between the tunnel resistor and the effective surface using one or more of a processing specification, the current flow, and a shift of a resonant frequency of the tunnel resistor.

10. The sensor as claimed in claim 1, wherein the first magnetic layer is a magnetic permalloy layer.

11. A method for detecting a position of an effective surface of a sensor including a first magnetic field generator, a magnetic tunnel resistor, and a second magnetic field generator, the method comprising:

generating a first magnetic field with the first magnetic field generator, the first magnetic field oriented on an axis of a direction of motion of the effective surface;

generating a second magnetic field with the second magnetic field generator, the second magnetic field oriented transversely to the axis;

detecting a current flow through the magnetic tunnel resistor, the magnetic tunnel resistor situated in extension of the axis at a distance from the first magnetic field generator; and evaluating the current flow using one or more of a processing specification, the current flow, and a shift of a resonant frequency of the tunnel resistor so as to determine a distance between the tunnel resistor and the effective surface, wherein the generated second magnetic field oscillates in resonance with an alternating current.

12. The method as claimed in claim 11, wherein the first magnetic layer is a magnetic permalloy layer.

* * * * *